United States Patent
Bedau (10) Patent No.: US 9,711,718 B1
(45) Date of Patent: Jul. 18, 2017

(54) NONVOLATILE BIPOLAR JUNCTION MEMORY CELL

(71) Applicant: Western Digital Technologies, Inc., San Jose, CA (US)

(72) Inventor: Daniel Bedau, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/141,761

(22) Filed: Apr. 28, 2016

(51) Int. Cl.
  *H01L 29/66* (2006.01)
  *H01L 45/00* (2006.01)

(52) U.S. Cl.
  CPC ........ *H01L 45/1206* (2013.01); *H01L 45/085* (2013.01); *H01L 45/1226* (2013.01); *H01L 45/1266* (2013.01); *H01L 45/146* (2013.01)

(58) Field of Classification Search
  CPC .............. H01L 45/085; H01L 45/1226; H01L 45/1266; H01L 45/146
  USPC ................ 257/47, 197, 205, 273, 373, 423
  See application file for complete search history.

(56) References Cited

U.S. PATENT DOCUMENTS

| | | | |
|---|---|---|---|
| 7,847,374 B1 | 12/2010 | Wang | |
| 7,898,848 B2 | 3/2011 | Pirovano et al. | |
| 8,138,574 B2 | 3/2012 | Chen et al. | |
| 8,174,046 B1 | 5/2012 | Tarabbia et al. | |
| 8,354,722 B2 * | 1/2013 | Campi, Jr. | H01L 29/742 257/355 |
| 8,558,210 B2 | 10/2013 | Rajendran et al. | |
| 8,837,204 B2 | 9/2014 | Asa | |
| 8,952,418 B2 | 2/2015 | Gupta et al. | |
| 2011/0260292 A1 | 10/2011 | Lin et al. | |
| 2012/0236626 A1 | 9/2012 | Gaillardon et al. | |
| 2014/0158970 A1 | 6/2014 | Tan et al. | |

OTHER PUBLICATIONS

A 90nm Phase Change Memory Technology for Stand-Alone Non-Volatile Memory Applications—http://ieeexplore.ieee.org/xpl/login.jsp?tp=&arnumber=1705247.
PCT International Search Report and Written Opinion dated May 9, 2017, for International Patent Application No. PCT/US2017/019165.

(Continued)

*Primary Examiner* — Tan N Tran
(74) *Attorney, Agent, or Firm* — Patterson & Sheridan, LLP (57) ABSTRACT

The present disclosure generally relates to an apparatus for a three terminal nonvolatile memory cell. Specifically, a three terminal nonvolatile bipolar junction transistor. The bipolar junction memory device includes a collector layer, a base layer disposed on the collector layer, an emitter layer disposed on the base layer, and a conductive anodic filament extending from the collector layer to the base layer. As current is applied to the transistor and a voltage is applied between P-N junction of the collector layer and the base layer, a conductive anodic filament (CAF) forms. The CAF is non-volatile and short circuits the reverse-biased P-N junction barrier thus keeping the device in a low-resistive state. Removing the CAF switches the device back to a high resistive state. Thus, a new type of semiconductor device advantageously combines computation and memory to form a flux-linkage modulated memory cell.

14 Claims, 5 Drawing Sheets

(56) References Cited

OTHER PUBLICATIONS

Surya et al,—"Highly conductive n- and p-type CuInO thin films by reactive evaporation," Journal of Alloys and compounds, vol. 600, Feb. 28, 2014, pp. 159-161.
Yanagi et al.—"Fabrication of all oxide transparent p-n homojunction using bipolar CuInO2 semiconducting oxide with delafossite structure," Solid State Communications, Pergamon, GB, vol. 121, No. 1, Jan. 1, 2001, pp. 15-18.

* cited by examiner

NONVOLATILE BIPOLAR JUNCTION MEMORY CELL

BACKGROUND OF THE DISCLOSURE

Field of the Disclosure

Embodiments of the present disclosure generally relate to a nonvolatile memory device, specifically a resistive random-access memory (ReRAM) device and select transistor.

Description of the Related Art

Nonvolatile memory is memory capable of retaining stored information even after having been power cycled. Nonvolatile memory is becoming more popular because of the small size/high density, low power consumption, fast read and write rates, and retention. Flash memory is a common type of nonvolatile memory due to high density and low fabrication costs. Flash memory is a transistor-based memory device that uses multiple gates per transistor and quantum tunneling for storing the information on its memory device. However, flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. New types of memory, such as resistive random access memory (ReRAM), are being developed as flash memory replacements to meet these demands. Resistive memories refer to technology that uses varying cell resistance to store information. ReRAM refers to the subset that uses metal oxides as the storage medium. In order to switch a ReRAM cell, an external voltage with specific polarity, magnitude, and duration is applied. However, ReRAM typically operates at a significantly high current. As such, ReRAM necessitates a large sized access transistor for each cell which ultimately increases the area and hence the cost.

Thus, there is a need in the art for an improved ReRAM memory device.

SUMMARY OF THE DISCLOSURE

The present disclosure generally relates to an apparatus for a three terminal nonvolatile memory cell. Specifically a three terminal nonvolatile bipolar junction transistor. The bipolar junction memory device includes a collector layer, a base layer disposed on the collector layer, an emitter layer disposed on the base layer, and a conductive anodic filament extending from the collector layer to the base layer. As current is applied to the transistor and a voltage is applied between P-N junction of the collector layer and the base layer, a conductive anodic filament (CAF) forms. The CAF is non-volatile and short circuits the reverse-biased P-N junction barrier thus keeping the device in a low-resistive state. Removing the CAF switches the device back to a high resistive state. Thus, a new type of semiconductor device advantageously combines computation and memory to form a flux-linkage modulated memory cell.

In one embodiment, a bipolar junction memory device is disclosed. The bipolar memory device may include a copper oxide collector layer, a copper-indium oxide base layer disposed on the collector layer, a copper oxide emitter layer disposed on the base layer, and an insulating layer disposed on the collector layer, the base layer, and the emitter layer. The bipolar memory device may also include a first metalized contact disposed on the insulating layer in contact with the emitter layer. The bipolar memory device may also include a second metalized contact disposed on the insulating layer in contact with the base layer. The bipolar memory device may also include a third metalized contact disposed on the insulating layer in contact with the collector layer.

In another embodiment, a bipolar junction memory device is disclosed. The bipolar memory device may include a collector layer, a base layer disposed on the collector layer, an emitter layer disposed on the base layer, and a conductive anodic filament extending from the collector layer to the base layer.

In another embodiment, a memory array including one or more bipolar junction memory devices is disclosed. At least one of the devices includes a collector layer, a base layer disposed on the collector layer, an emitter layer disposed on the base layer, and a conductive anodic filament extending from the collector layer to the base layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to an apparatus for a three terminal nonvolatile memory cell. Specifically a three terminal nonvolatile bipolar junction transistor. The bipolar junction memory device includes a collector layer, a base layer disposed on the collector layer, an emitter layer disposed on the base layer, and a conductive anodic filament extending from the collector layer to the base layer. As current is applied to the transistor and a voltage is applied between P-N junction of the collector layer and the base layer, a conductive anodic filament (CAF) forms. The CAF is non-volatile and short circuits the reverse-biased P-N junction barrier thus keeping the device in a low-resistive state. Removing the CAF switches the device back to a high resistive state. Thus, a new type of semiconductor device advantageously combines computation and memory to form a flux-linkage modulated memory cell.

Figure 1A:
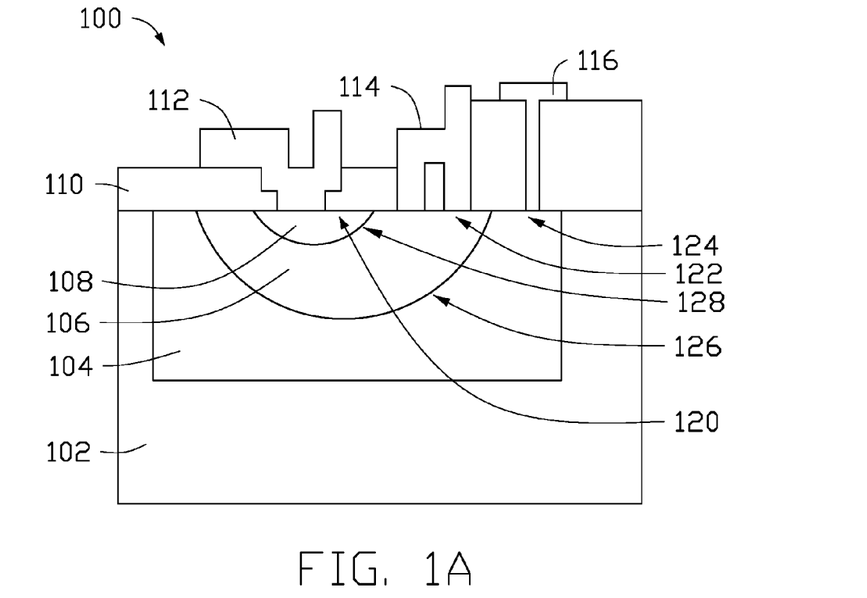
FIG. 1A shows a schematic illustration of a bipolar junction memory device according to one embodiment.

FIG. 1A shows a schematic illustration of a bipolar junction memory device 100 according to one embodiment. The bipolar junction memory device 100 may include a substrate 102, a collector layer 104, a base layer 106, an emitter layer 108, an insulating layer 110, a first metalized contact 112, a second metalized contact 114, and a third metalized contact 116. Although the bipolar junction memory device 100 described below provides for a NPN bipolar junction transistor, the present disclosure may also be utilized with a PNP bipolar junction transistor with drive polarities and dopant species reversed.

The first metalized contact 112 may be disposed on the insulating layer 110 and be in contact with the emitter layer 108. In one embodiment, the emitter layer 108 has a surface 120 that is in contact with both the insulating layer 110 and the first metalized contact 112. The first metalized contact 112 may be a metal selected from a group consisting of copper (Cu) or tungsten (W). The second metalized contact 114 may be disposed on the insulating layer 110 and be in contact with the base layer 106. In one embodiment, the base layer 106 has a surface 122 that is in contact with both the insulating layer 110 and the second metalized contact 114. The second metalized contact 114 may be a metal selected from a group consisting of copper (Cu) or tungsten (W). The third metalized contact 116 may be disposed on the insulating layer 110 and be in contact with the collector layer 104. In one embodiment, the collector layer 104 has a surface 124 that is in contact with both the insulating layer 110 and the third metalized contact 116. The third metalized contact 116 may be a metal selected from a group consisting of copper (Cu) or tungsten (W). In one embodiment, the surface 120 of the emitter layer 108 may be substantially planar to the surface 122 of the base layer 106 and the surface 124 of the collector layer 104. The insulating layer 110 may be disposed on the emitter layer 108, the base layer 106, the collector layer 104, and the substrate 102. The insulating layer 110 may be silicon dioxide.

The collector layer 104 may be disposed on the substrate 102. The substrate 102 may be silicon. The collector layer 104 may be formed on the substrate 102 by epitaxial growth or ion implantation. In one embodiment, the collector layer 104 is a ReRAM material such as copper oxide. The base layer 106 may be disposed on the collector layer 104. In one embodiment, the base layer 106 is a ReRAM material such as copper-indium oxide. The emitter layer 106 may be disposed on the base layer 106. In one embodiment, the emitter layer 106 may include copper oxide. In one embodiment the collector layer 104 may be N-conducting, the base layer 106 may be P-conducting, and the emitter layer 108 may be N-conducting. In another embodiment, the collector layer 104 may be P-conducting, the base layer 106 may be N-conducting, and the emitter layer 108 may be P-conducting.

Two P-N junctions are formed in the bipolar junction memory device 100 by the combination of materials used. One P-N junction limits a current in one direction and the other limits a current in the opposite direction. The first P-N junction 128 is between the N-conducting emitter layer and the P-conducting base layer 106. The first P-N junction 128 is in the forward biased direction. The second P-N junction 126 is between the P-conducting base layer 106 and the N-conducting collector layer 104. The second P-N junction 126 is in the reverse biased direction that can be reversibly short-circuited or switched. The P-N junctions create a potential energy barrier for electrons and holes formed near the junctions. Advantageously, the combination of material used in the second P-N junction 126 may also facilitate the formation of a filament, discussed below, providing for different resistive states for a memory device.

When two different resistive states are identified (i.e., a high resistive state and a low resistive state) for a memory device, one state may be associated with a logic "zero," while the other state may be associated with the logic "one" value. The combination of the two P-N junctions 126, 128 provides a high resistive state where current cannot flow. The bipolar junction memory device 100 is in the non-conducting state due to the electric field barrier created by the first P-N junction 128 at the interface between the emitter layer 108 and the base layer 106 and electric field barrier created by the second P-N junction 126 at the interface between the base layer 106 and the collector layer 104. In other words, at zero voltage, the P-N junctions 126, 128 keep current from flowing between the collector layer 104 and the emitter layer 108. A base current applied from the emitter layer 108 through the base layer 106 will turn on the bipolar junction transistor; however, the current alone is not enough to form a filament. As such, the bipolar junction memory device 100 is in a high resistive state. By utilizing ReRAM memory material in the base layer 106 and the collector layer 104, the bipolar junction memory device 100 advantageously may provide for filament formation as described below. The filament formation provides for a low resistive state and thus provides for a non-volatile memory. In other words, the combination of copper oxide and copper-indium oxide advantageously provides for both resistive switching and the formation of a P-N junction. The P-N junction formed between the collector layer and the base layer can be reversibly short-circuited by the formation or removal of the filament.

Figure 1B:
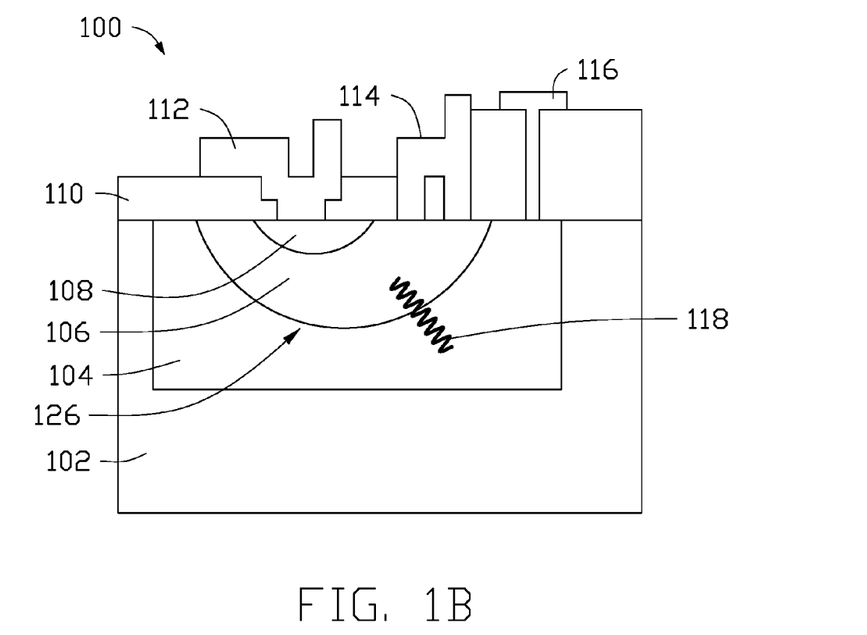
FIG. 1B shows a schematic illustration of the bipolar junction memory device of FIG. 1A after applying current and voltage.

FIG. 1B shows a schematic illustration of the bipolar junction memory device 100 of FIG. 1A after applying current and voltage. The bipolar junction memory device 100 may include the substrate 102, the collector layer 104, the base layer 106, the emitter layer 108, the insulating layer 110, the first metalized contact 112, the second metalized contact 114, the third metalized contact 116, and a conductive anodic filament (CAF) 118. In one embodiment, the base layer 106, the collector layer 104, and the emitter layer 108 each may include compounds that include copper. A base current and a voltage applied between the collector layer 104 and the emitter layer 108 induces the CAF 118 formation and causes a breakdown of the second P-N junction 126. In one embodiment, the CAF 118 forms across the second P-N junction 126. The CAF 118 remains even when the current and voltage is stopped, thus short-circuiting the P-N junction 126. After the formation of the CAF 118, the bipolar junction memory device 100 switches to a low resistance state. As such, the formation of the CAF 118 across the second P-N junction 126 provides for a state associated with either 0 or 1.

Figure 1C:
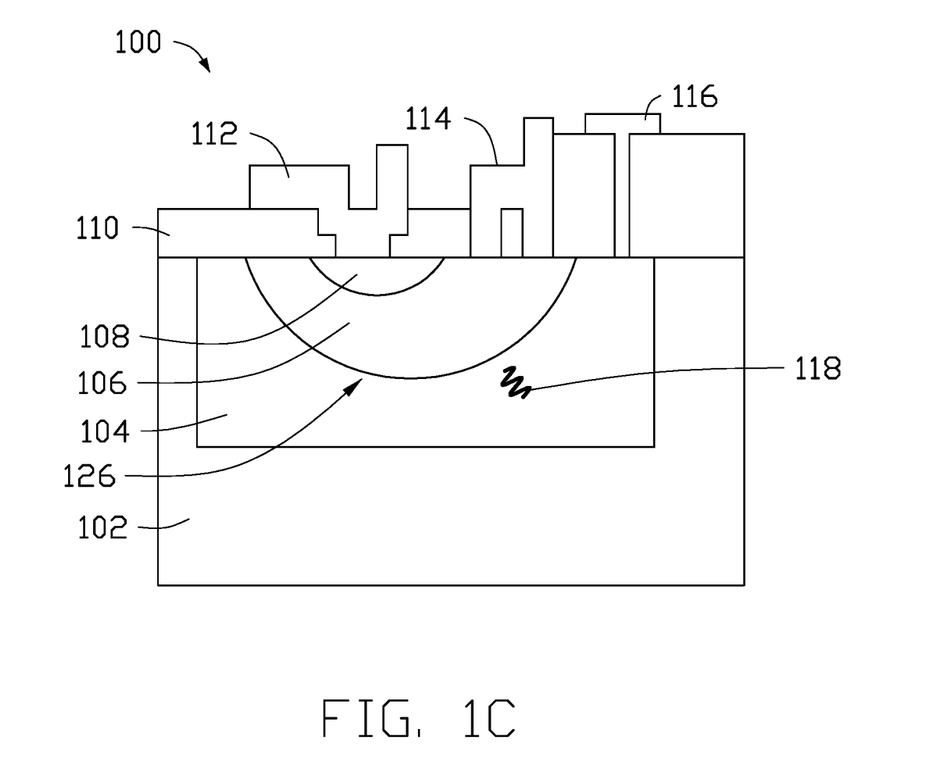
FIG. 1C shows a schematic illustration of the bipolar junction memory device of FIG. 1B after applying a reverse voltage.

FIG. 1C shows a schematic illustration of the bipolar junction memory device of FIG. 1B after applying a reverse voltage. The bipolar junction memory device 100 may include the substrate 102, the collector layer 104, the base layer 106, the emitter layer 108, the insulating layer 110, the first metalized contact 112, the second metalized contact 114, the third metalized contact 116, and the CAF 118. To return the bipolar junction memory device 100 to a high resistive state, the second P-N junction 126 is restored. Thus, the second P-N junction 126 can be reversibly short-circuited. A reverse voltage is applied between the collector layer 104 and the base layer 106 to break the CAF 118. A portion of the CAF 118 may remain in the collector layer 104. The combination of the two P-N junctions, 126, 128 again provide a high resistive state where current cannot flow thus, representing a state associated with either 0 or 1. A new filament can then be formed by applying both current and voltage to the bipolar junction memory device 100. The two states advantageously provide for a nonvolatile memory device in a bipolar junction transistor eliminating the need for a separate transistor.

Figure 2A:
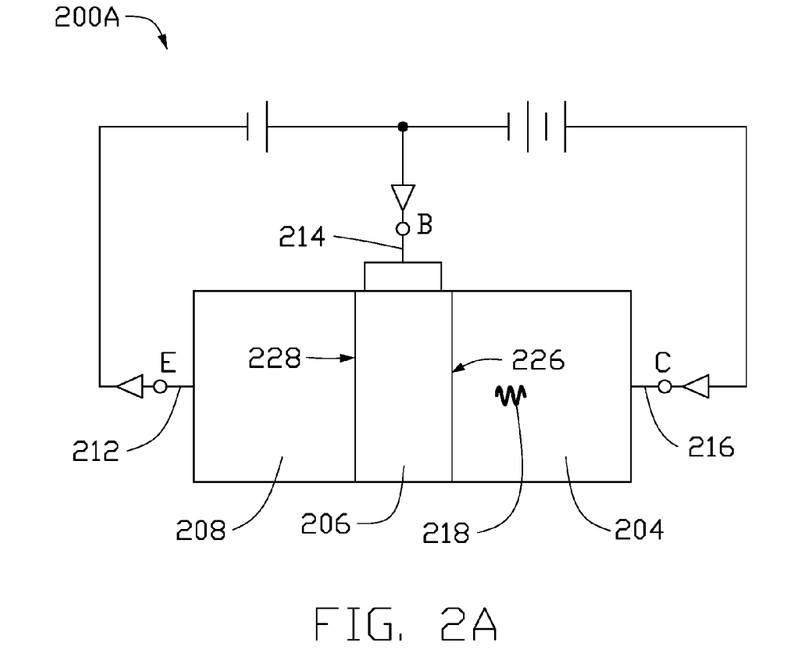
FIG. 2A shows a schematic symbol representation of a bipolar junction memory device according to one embodiment.

FIG. 2A shows a schematic symbol representation of a bipolar junction memory device 200A according to one embodiment. The bipolar junction memory device 200A may be understood to be the bipolar junction memory device 100 of FIGS. 1A-1C. The bipolar junction memory device 200A is in a high resistance state. The schematic shows a collector layer 204, a base layer 206, an emitter layer 208, a first metalized contact 212, a second metalized contact 214, a third metalized contact 216, a CAF 218, a first P-N junction 228, and a second P-N junction 226. The first P-N junction 228 is formed by the emitter layer 208 and the base layer 206. The second P-N junction is formed by the base layer 206 and the collector layer 204 and limits current in the opposite or reverse direction. In the high resistive state, the CAF 218 is contained within the collector layer 204.

Figure 2B:
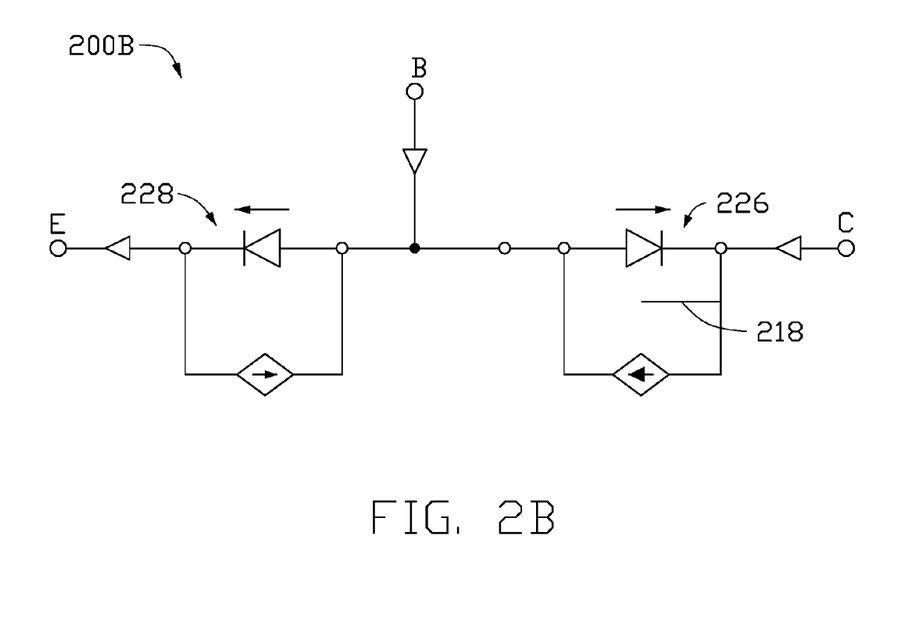
FIG. 2B shows a schematic illustration of the electric current flow of the bipolar junction memory device of FIG. 2A.

FIG. 2B shows a schematic illustration of the electric current flow of the bipolar junction memory device 200B. It should be understood that the bipolar junction memory device 200B may be the bipolar junction memory device 200A. As seen in FIG. 2B, the bipolar junction device 200B has two P-N junctions 226, 228 that may be represented as diodes. The first P-N junction 228 limits current in a forward direction. The second P-N junction limits current in the opposite or reverse direction. The combination of the two P-N junctions 226, 228 provides for a high resistive state where current is not flowing, shown in FIGS. 2A-2B. In the high resistive state, the CAF 218 does not cross the second P-N junction 226.

Figure 3A:
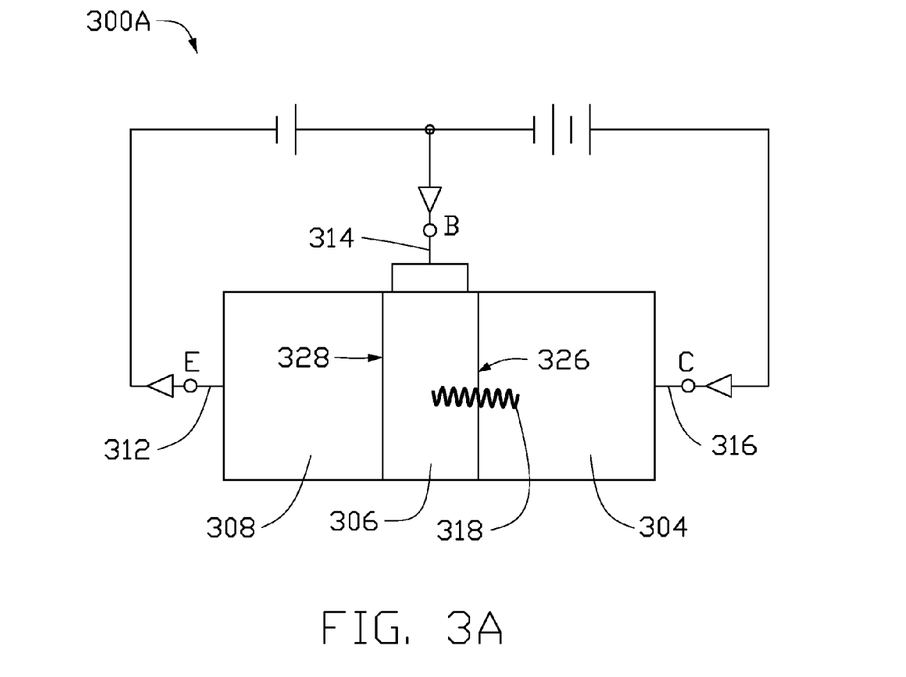
FIG. 3A shows a schematic symbol representation of a bipolar junction memory device in a low resistance state.

FIG. 3A shows a schematic symbol representation of a bipolar junction memory device 300A in a low resistance state. The bipolar junction memory device 300A may be understood to be the bipolar junction memory device 100 of FIGS. 1A-1C. The schematic shows a collector layer 304, a base layer 306, an emitter layer 308, a first metalized contact 312, a second metalized contact 314, a third metalized contact 316, a CAF 318, a first P-N junction 328, and a second P-N junction 326. The first P-N junction 328 is formed by the emitter layer 308 and the base layer 306. The second P-N junction is formed by the base layer 306 and the collector layer 304 and limits current in the opposite or reverse direction. In the low resistive state, the CAF 318 crosses the second P-N junction 326 and provides for a continual flow of current even when the power is turned off. The CAF 318 short-circuits the second P-N junction 326.

Figure 3B:
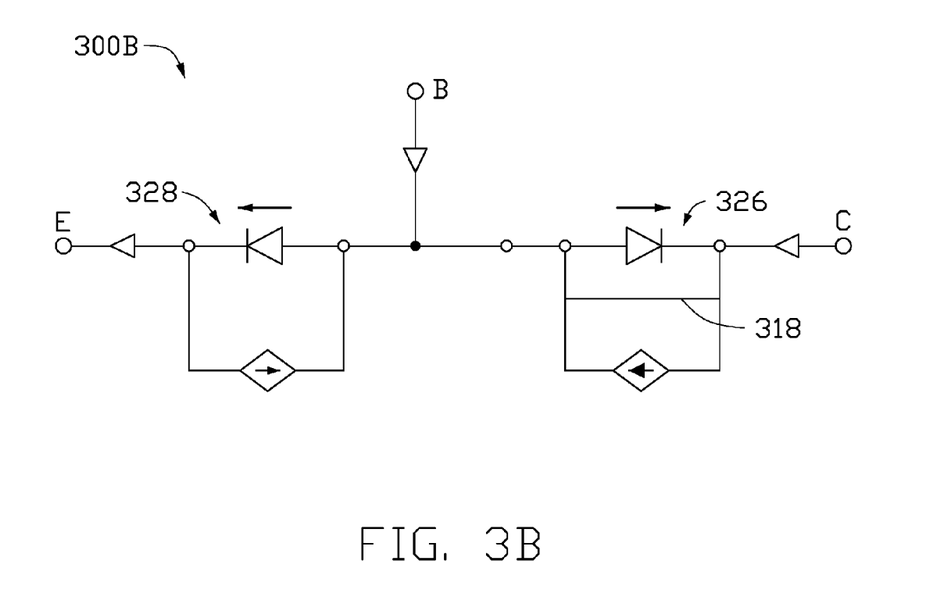
FIG. 3B shows a schematic illustration of the electric current flow of the bipolar junction memory device of FIG. 3A.

FIG. 3B shows a schematic illustration of the electric current flow of the bipolar junction memory device 300B. It should be understood that the bipolar junction memory device 300B may be the bipolar junction memory device 300A. As seen in FIG. 3B, the bipolar junction device 300B has two P-N junctions 326, 328 that may be represented as diodes. The first P-N junction 328 limits current in a forward direction. The second P-N junction limits current in the opposite or reverse direction. The current can by-pass the second P-N junction 326 through the CAF 318 and provide for a low resistive state.

Figure 4:
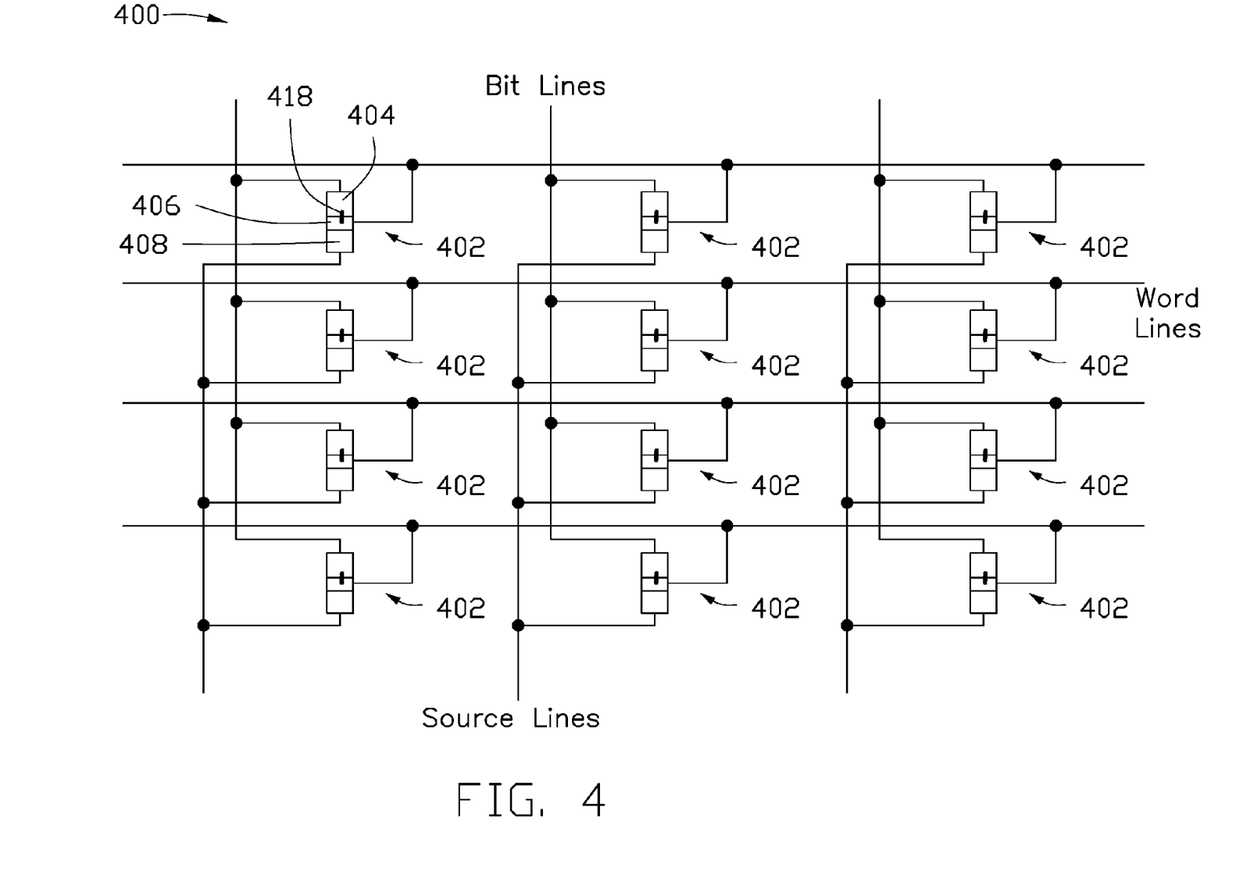
FIG. 4 shows a schematic illustration of a memory array that may include one or more bipolar junction memory devices.

Additionally, the three terminal memory device provides for selecting individual ReRAM memory cells in series or NAND configuration, a configuration not previously possible with ReRAM cells. The bipolar junction memory devices described above can thus form a memory array. FIG. 4 shows a schematic illustration of a memory array 400 that may include one or more bipolar junction memory devices 402. At least one of the bipolar junction memory devices 402 includes a collector layer 404, a base layer 406, an emitter layer 408, and a conductive anodic filament (CAF) 418. The CAF 418 extends from the collector layer 404 to the base layer 406. The bipolar junction memory devices 402 may be P-N-P conducting or N-P-N conducting. The collector layer 404, the base layer 406, and the emitter layer 408 may each include compounds that contain copper. The bipolar junction memory devices 402 may be substantially similar to the bipolar junction memory device 100 described in FIGS. 1A-1C.

The three terminal resistive random access memory device having P-N junctions can switch from a low resistive state to a high resistive state using the conductive anodic filament. The CAF short-circuits the reverse-biased P-N junction thus keeping the device in a low resistance state. Removing the CAF switches the device back to a high resistance state. Thus, a new type of semiconductor device advantageously combines computation and memory by having a three terminal structure that is able to switch electronic signals with the additional capability of retaining information when the power is turned off.

While the foregoing is directed to embodiments of the present disclosure, other and further embodiments of the disclosure may be devised without departing from the basic scope thereof, and the scope thereof is determined by the claims that follow.

What is claimed is:
1. A bipolar junction memory device, comprising:
   a collector layer;
   a base layer disposed on the collector layer;
   an emitter layer disposed on the base layer; and
   a conductive anodic filament extending from the collector layer to the base layer.
2. The device of claim 1, wherein the collector layer is N-conducting.
3. The device of claim 2, wherein the base layer is P-conducting.

4. The device of claim 3, wherein the emitter layer is N-conducting.

5. The device of claim 1, wherein the collector layer is P-conducting.

6. The device of claim 5, wherein the base layer is N-conducting.

7. The device of claim 6, wherein the emitter layer is P-conducting.

8. The device of claim 1, wherein the base layer, collector layer and emitter layer each comprise compounds that include copper.

9. A memory array comprising one or more bipolar junction memory devices, at least one of the devices, comprising:
   a collector layer;
   a base layer disposed on the collector layer;
   an emitter layer disposed on the base layer; and
   a conductive anodic filament extending from the collector layer to the base layer.

10. The memory array of claim 9, wherein the collector layer is N-conducting.

11. The memory array of claim 10, wherein the base layer is P-conducting.

12. The memory array of claim 11, wherein the emitter layer is N-conducting.

13. The memory array of claim 12, wherein the base layer, the collector layer and the emitter layer each comprise compounds that include copper.

14. The memory array of claim 9, wherein the base layer, the collector layer and the emitter layer each comprise compounds that include copper.

* * * * *